United States Patent [19]
Chang et al.

[11] Patent Number: 6,004,877
[45] Date of Patent: Dec. 21, 1999

[54] METHOD OF FORMING A TUNGSTEN LAYER WITH N2 PLASMA TREATMENT

[75] Inventors: Tony Liang-Tung Chang; Shiang-Peng Cheng, both of Hsinchu, Taiwan

[73] Assignee: Vanguard International Semiconductor Corporation, Taiwan

[21] Appl. No.: 09/031,259

[22] Filed: Feb. 26, 1998

[51] Int. Cl.⁶ .............................................. H01L 21/4763
[52] U.S. Cl. ............................................................ 438/643
[58] Field of Search ..................................... 438/643, 644, 438/656, 685, 642, 612, 629, 653, 672, 654; 257/763, 751, 753, 724

[56] References Cited

U.S. PATENT DOCUMENTS 5,827,777  9/1996  Schinella et al. ........................ 438/629
5,892,285  2/1997  Gonzalet et al. ........................ 257/763

*Primary Examiner*—Charles Bowers
*Assistant Examiner*—Craig Thompson
*Attorney, Agent, or Firm*—Christensen, O'Connor, Johnson & Kindness PLLC

[57] ABSTRACT

A titanium layer is formed on a dielectric layer. A TiN layer is formed on the titanium layer to act as a barrier layer. A rapid thermal annealing is performed. A tungsten layer is deposited by useing chemical vapor deposition with $N_2$ plasma treatment. In a preferred embodiment, the temperature of the deposition ranges from 300 to 500 degrees centigrade. The gas pressure of the process is about 2 to 4 torr. The power of the plasma is about 300 to 800 Further, the treatment time of the $N_2$ plasma ranges from 50 to 150 seconds. An etching back step is carried to etch a portion of the tuugsten layer.

14 Claims, 1 Drawing Sheet

METHOD OF FORMING A TUNGSTEN LAYER WITH N2 PLASMA TREATMENT

FIELD OF THE INVENTION

The present invention relates to a process for manufacturing integrated circuits, and more specifically, to a process for manufacturing a tungsten layer in a semiconductor device.

BACKGROUND OF THE INVENTION

An electrically connecting structure such as an interconnection for connecting elements between semiconductor devices is becoming more critical as the sizes of the devices are scaled down. Typically, the interconnection or other electrically conducting elements are widely used for providing specific conducting paths in an electrical circuit. In the process of forming the electrical conducting structure over an underlying layer, it is important that the surface of the underlying layer be free of any contamination, such as moisture, particles or oxides. Further, the surface of the underlying layer must be planar for subsequent layer deposition.

Tungsten is one of the common materials used in the formation of an electrical conducting structure. Before forming a tungsten layer over a underlying layer, a composition layer consisting of Ti and TiN layers must be formed along the surface of the underlying layer to act as a barrier layer. A rapid thermal annealing step is subsequently employed after the barrier layer is formed. However, the so called "micro-crack" phenomenon will occur after rapid thermal annealing. The phenomenon is attributed to stress release for the barrier layer. In the conventional method, the tungsten layer can be deposited by using chemical vapor deposition on the Ti and TiN composition layers. The reaction material for forming the tungsten layer includes $WF_6$ and $SiH_4$. Fluorine gas will be generated during the reaction. The fluorine penetrates through the micro-cracks and reacts with the titanium atoms. Thus, a by-product consisting of $TiF_x$ is generated and explodes out of the barrier layer and tungsten layer. This is referred to as the "volcano effect". This effect creates undesired tungsten particles on the surface of the tungsten layer.

What is required is a method of forming a tungsten layer free from particle contamination.

SUMMARY OF THE INVENTION

A dielectric layer is formed over the substrate for the purposes of isolation. Then, a glue layer composed of titanium is formed along the surface of the dielectric layer. A TiN layer is formed on the glue layer to act as a barrier layer. The TiN layer is formed by using physical vapor deposition. The TiN layer is used to prevent the Ti layer from reacting with subsequent layer. A rapid thermal annealing is performed at a temperature of about 500 to 700 centigrade.

A tungsten layer is deposited by using chemical vapor deposition with $N_2$ plasma treatment. The reaction material for forming the tungsten layer includes $WF_6$ and $SiH_4$. The $N_2$ plasma can prevent the fluorine from penetrating through the micro-crack because the $N_2$ plasma can bond the micro-crack with N-radicals after the Ti/TiN layer annealing. In a preferred embodiment, the temperature of the deposition ranges from 300 to 500 degrees centigrade. The gas pressure of the process is about 2 to 4 torr. The power of the plasma is about 300 to 800 W. Further, the treatment time of the $N_2$ plasma ranges from 50 to 150 seconds. Finally, an etching back step is performed to etch a portion of the tungsten layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A method is disclosed for particle free deposition of a tungsten layer for use as an electrical conducting structure. A plasma treatment will be used during the formation of the electrical conducting structure to overcome the prior art problem of the "volcano effect". As will be seen below, these techniques can be used for improving the performance of an electrical conducting structure.

Figure 1:
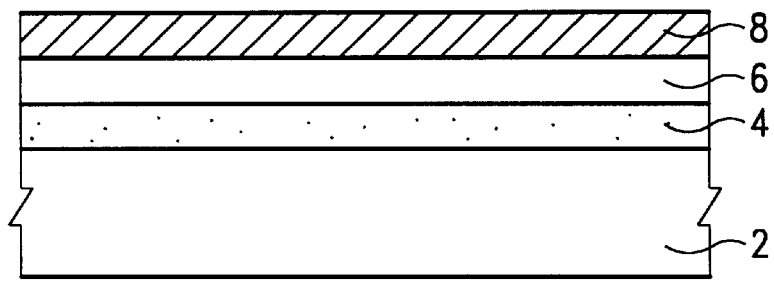
FIG. 1 is a cross sectional view of a semiconductor wafer illustrating the steps of forming a glue layer, a barrier layer over a wafer and performing a rapid thermal process in accordance with the present invention.

Referring to FIG. 1, in the preferred embodiment, a silicon wafer 2 is provided with a <100> crystallographic orientation. Next, a dielectric layer 4 is formed over the substrate for the purposes of isolation. Typically, the dielectric layer 4 is composed of silicon oxide, silicon nitride, BPSG or the like. For example, a silicon oxide layer 4 may be formed over the substrate 2 by using a chemical vapor deposition process. Alternatively, the silicon oxide 4 layer can be formed by thermal oxidation in oxygen ambient of the substrate in a conventional manner.

Next, a glue layer 6 composed of titanium (Ti) is formed along the surface of the silicon oxide layer 4 to have a thickness of between 100 to 800 ngstroms by a sputtering technique. In the preferred embodiment, the temperature of the sputtering is about room temperature that is about 25 degrees centigrade. Further, the flow rate of argon gas in the chamber is about 10 to 40 sccm.

A titanium-nitride (TiN) layer 8 is formed on the glue layer 6 to act as a barrier layer. The TiN layer 8 is preferably formed by using physical vapor deposition. The thickness of the TiN layer 8 is approximately 400 to 1000 angstroms. The temperature of the TiN layer 8 during formation is about room temperature that is about 25 degrees centigrade. Further, the flow rate of argon gas in the chamber is about 10 to 40 sccm, and the flow rate of nitrogen gas in the chamber is about 25 to 100 sccm. The TiN layer 8 is introduced to prevent the Ti 6 layer from reacting with a subsequent layer. Specifically, it has been found that a reaction will occur between a fluorine and titanium, which will cause the volcano effect. Still referring to FIG. 1, the next step is a rapid thermal process (RTP) for annealing at a temperature about 500 to 700 degrees centigrade for about 30 to 120 seconds.

Figure 2:
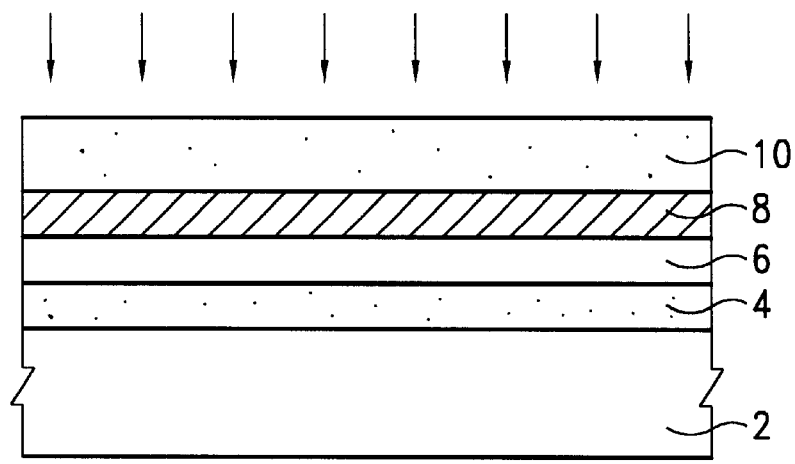
FIG. 2 is a cross sectional view of a semiconductor wafer illustrating the step of forming a tungsten layer over the wafer in accordance with the present invention.

Turning to FIG. 2, a tungsten layer 10 is deposited by using chemical vapor deposition with $N_2$ plasma treatment. The reaction material for forming the tungsten layer includes $WF_6$ and $SiH_4$. The $N_2$ plasma can prevent the fluorine from penetrating through the micro-crack due to the $N_2$ plasma bonding the micro-crack with N-radicals after the Ti/TiN layer annealing. In a preferred embodiment, the temperature of the deposition ranges from 300 to 500 centigrade.

The gas pressure of the process is about 2 to 4 torr. The power of the plasma is about 300 to 800 W. Further, the treatment time of the $N_2$ plasma ranges from 50 to 150 seconds.

Figure 3:
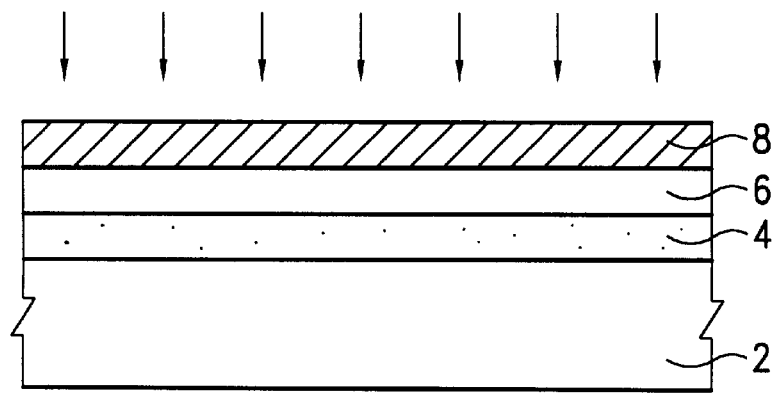
FIG. 3 is a cross sectional view of a semiconductor wafer illustrating the step of etching back the tungsten layer in accordance with the present invention.

Turning to FIG. 3, an etching back step is carried to etch the tungsten layer 10. After the aforesaid steps, the structure is scanned by test equipment, such as the Tencor 7700, to measure the amount of tungsten particles. In the actual embodiment, the amount of the particles is less than forty in an area of an eight inch wafer.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. Thus, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming an electrically conducting structure over a semiconductor wafer, said method comprising the steps of:

forming a dielectric layer over said semiconductor wafer for isolation;

forming a titanium (Ti) layer on said dielectric layer to act as a glue layer;

forming a titanium-nitride (TiN) layer on said Ti layer to act as a barrier layer;

performing a rapid thermal process (RTP) for annealing; and forming a tungsten layer on said TiN layer with an $N_2$ plasma treatment.

2. The method of claim 1, further comprising the step of etching back said tungsten layer after forming said tungsten layer.

3. The method of claim 1, wherein said tungsten layer is formed by chemical vapor deposition.

4. The method of claim 1, wherein said tungsten layer is formed with reaction materials including $WF_6$ and $SiH_4$.

5. The method of claim 1, wherein the power of said $N_2$ plasma treatment is about 300 to 800 W.

6. The method of claim 1, wherein the time of said $N_2$ plasma treatment is about 50 to 150 seconds.

7. The method of claim 1, wherein the pressure of forming said tungsten layer is about 2 to 4 torr.

8. The method of claim 1, wherein the temperature of forming said tungsten layer is about 300 to 500 centigrade.

9. A method of forming an electrically conducting structure over a semiconductor wafer, said method comprising the steps of:

forming a dielectric layer over said semiconductor wafer for isolation;

forming a titanium (Ti) layer on said dielectric layer to act as a glue layer;

forming a titanium-nitride (TiN) layer on said Ti layer to act as a barrier layer;

performing a rapid thermal process (RTP) for annealing; and forming a tungsten layer on said TiN layer with $N_2$ plasma treatment, wherein the power of said $N_2$ plasma treatment is about 300 to 800 W and the time of said $N_2$ plasma treatment is about 50 to 150 seconds.

10. The method of claim 9, further comprising the step of etching back said tungsten layer after forming said tungsten layer.

11. The method of claim 9, wherein said tungsten layer is formed by chemical vapor deposition.

12. The method of claim 9, wherein said tungsten layer is formed with reaction materials including $WF_6$ and $SiH_4$.

13. The method of claim 9, wherein the pressure of forming said tungsten is about 2 to 4 torr.

14. The method of claim 9, the temperature of forming said tungsten layer is about 300 to 500 degrees centigrade.

* * * * *